(12) United States Patent
Plach et al.

(10) Patent No.: US 9,252,042 B2
(45) Date of Patent: Feb. 2, 2016

(54) METHOD FOR PERMANENT BONDING OF WAFERS

(75) Inventors: Thomas Plach, Linz (AT); Kurt Hingerl, Wolfern (AT); Markus Wimplinger, Ried im Innkreis (AT); Christoph Flötgen, Pramerdorf (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 76 days.

(21) Appl. No.: 13/981,353

(22) PCT Filed: Jan. 25, 2011

(86) PCT No.: PCT/EP2011/000299
§ 371 (c)(1),
(2), (4) Date: Jul. 31, 2013

(87) PCT Pub. No.: WO2012/100786
PCT Pub. Date: Aug. 2, 2012

(65) Prior Publication Data
US 2013/0299080 A1    Nov. 14, 2013

(51) Int. Cl.
*H01L 21/70* (2006.01)
*H01L 21/18* (2006.01)
*H01L 21/20* (2006.01)
*H01L 21/762* (2006.01)

(52) U.S. Cl.
CPC .............. *H01L 21/70* (2013.01); *H01L 21/187* (2013.01); *H01L 21/2007* (2013.01); *H01L 21/76251* (2013.01)

(58) Field of Classification Search
CPC .... H01L 21/187; H01L 21/70; H01L 21/2007
See application file for complete search history.

(56) References Cited

U.S. PATENT DOCUMENTS

| | | | |
|---|---|---|---|
| 5,427,638 A | 6/1995 | Goetz et al. | 156/153 |
| 5,451,547 A | 9/1995 | Himi et al. | 437/225 |
| 6,022,460 A | 2/2000 | O et al. | 204/298.6 |

(Continued)

FOREIGN PATENT DOCUMENTS

| | | | |
|---|---|---|---|
| EP | 0 584 778 A2 | 3/1994 | H01L 21/20 |
| JP | 2007-12583 | 1/2007 | H01M 8/02 |

(Continued)

OTHER PUBLICATIONS

Suni et al., "Effects of Plasma Activation on Hydrophilic Bonding of Si and SiO$_2$," Journal of The Electrochemical Society, vol. 149, No. 6, pp. G348-G351, Jun. 30, 2002.

(Continued)

*Primary Examiner* — Daniel McNally
(74) *Attorney, Agent, or Firm* — Kusner & Jaffe

(57) ABSTRACT

A method for bonding of a first contact surface of a first substrate to a second contact surface of a second substrate according to the following steps: forming a reservoir in a surface layer on the first contact surface, at least partially filling the reservoir with a first educt or a first group of educts, contacting the first contact surface with the second contact surface for formation of a prebond connection, and forming a permanent bond between the first and second contact surface, at least partially strengthened by the reaction of the first educt with a second educt contained in a reaction layer of the second substrate.

30 Claims, 3 Drawing Sheets

(56) References Cited

U.S. PATENT DOCUMENTS

| | | | |
|---|---|---|---|
| 7,670,708 B2 | 3/2010 | Yamada et al. | 429/34 |
| 2002/0048900 A1 | 4/2002 | Lo et al. | 438/455 |
| 2003/0079822 A1 | 5/2003 | Sabia | 156/99 |
| 2003/0089950 A1 | 5/2003 | Kuech et al. | 257/352 |
| 2003/0211705 A1 | 11/2003 | Tong et al. | 438/455 |
| 2004/0171231 A1 | 9/2004 | Yanagita et al. | 438/455 |
| 2006/0032582 A1 | 2/2006 | Chen et al. | 156/272.6 |
| 2006/0043483 A1 | 3/2006 | Shaheen et al. | 257/347 |
| 2006/0240642 A1* | 10/2006 | Kerdiles | 438/455 |
| 2006/0260642 A1 | 11/2006 | Verhaverbeke et al. | 134/1.3 |
| 2007/0020947 A1 | 1/2007 | Daval et al. | 438/758 |
| 2008/0006369 A1 | 1/2008 | Lim et al. | 156/308.6 |
| 2009/0098709 A1 | 4/2009 | Ohnuma et al. | 438/458 |
| 2009/0111243 A1 | 4/2009 | Landru et al. | 438/458 |
| 2009/0294072 A1* | 12/2009 | Kerdiles et al. | 156/380.9 |
| 2010/0029058 A1 | 2/2010 | Shimomura et al. | 438/458 |
| 2010/0193897 A1 | 8/2010 | Sinha et al. | 257/506 |
| 2013/0207244 A1 | 8/2013 | David et al. | 257/632 |

FOREIGN PATENT DOCUMENTS

| | | | | |
|---|---|---|---|---|
| JP | 2008513975 | | 5/2008 | H01L 24/29 |
| JP | 2008-535230 | | 8/2008 | H01L 21/02 |
| JP | 5166690 | | 3/2013 | H01M 8/02 |
| KR | 10-2007-0114769 | | 12/2007 | H01L 21/203 |
| WO | WO 01/61743 | | 8/2001 | H01L 21/48 |
| WO | WO 2006/093817 | | 9/2006 | |
| WO | WO 2007/060145 | | 5/2007 | H01L 21/762 |
| WO | WO 2008/114099 | | 9/2008 | H01L 21/2007 |

OTHER PUBLICATIONS

International Search Report for International Application No. PCT/EP2011/000299, Oct. 10, 2011.

Office Action issued in connection with corresponding Japanese Patent Application No. 2013-549719, dated Oct. 27, 2014.

Weinert A. et al., "Plasma Assisted Room Temperature Bonding for MST," Sensors and Actuators A, Elsevier Sequoia S.A., Lausanne, Sweden, vol. 92, No. 1-3, Aug. 1, 2001, pp. 214-222.

International Search Report for related PCT/EP2011/055469 dated Dec. 1, 2012.

International Search Report for related PCT/EP2011/055470 dated Dec. 1, 2012.

International Search Report for related PCT/EP2011/055471 dated Dec. 1, 2012.

International Search Report for related PCT/EP2012/064545 dated May 14, 2013.

Office Action issued in connection with related Singapore Patent Application No. 2013068333 dated Sep. 12, 2014.

Office Action issued in connectbn with related Korean Patent Application No. 10-2013-7025905.

Office Action issued in connection with related Taiwanese Patent Application No. 101102642 dated Sep. 3, 2015 (with English-language translation).

* cited by examiner

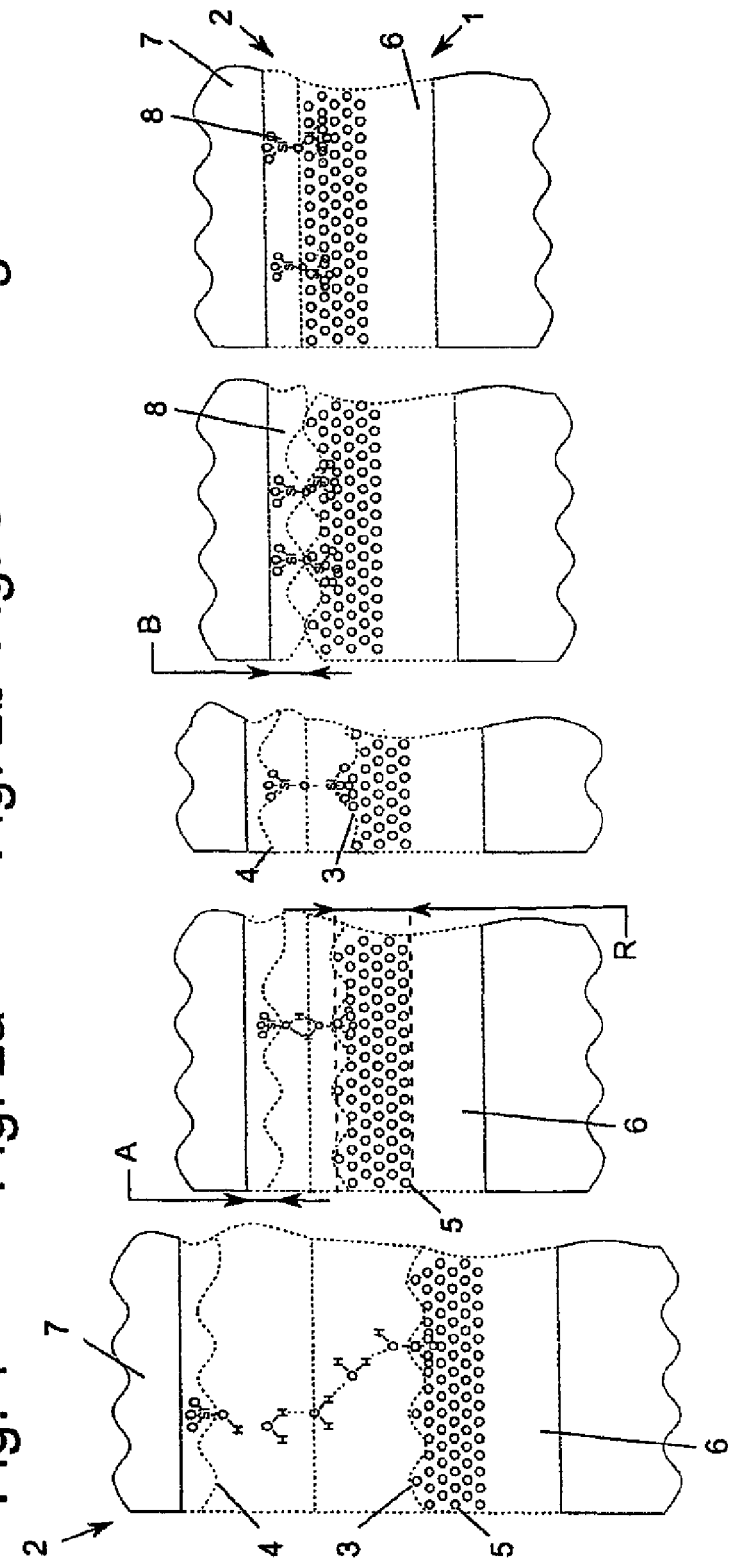

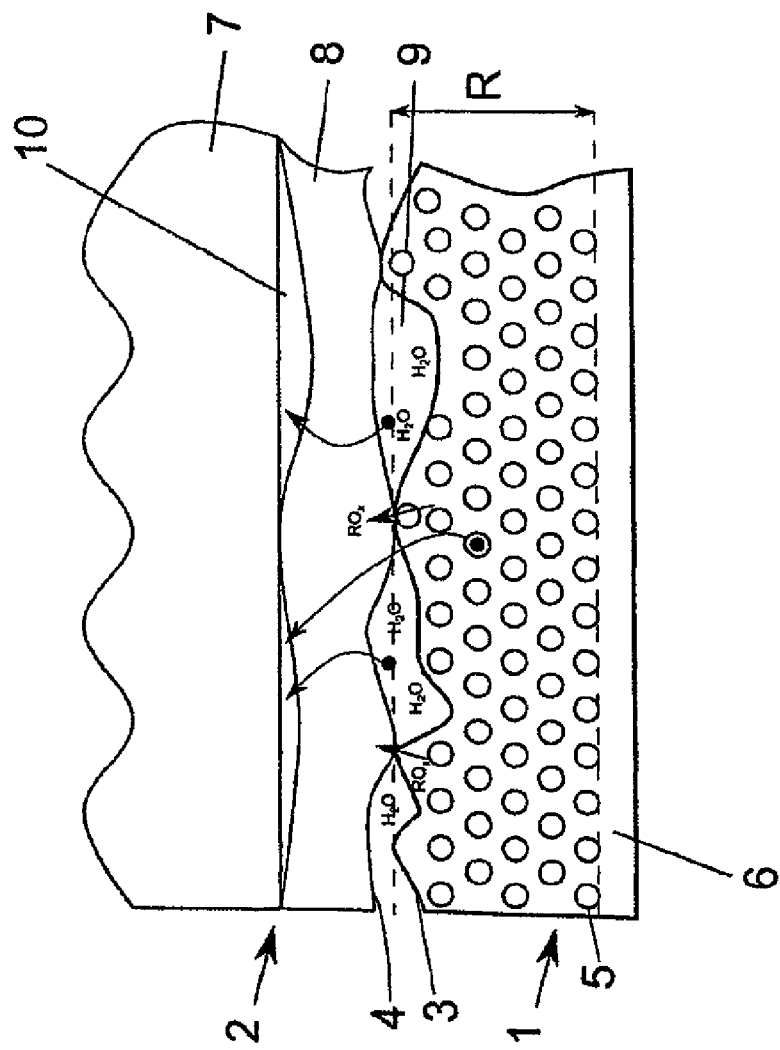
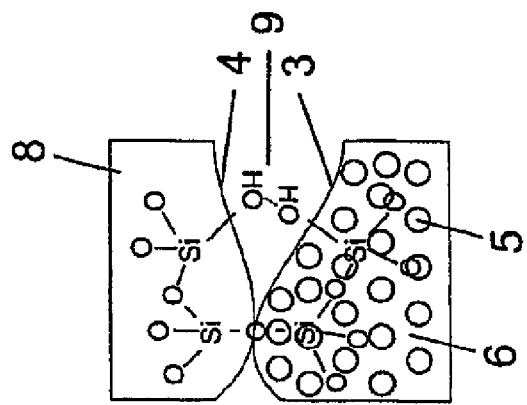

METHOD FOR PERMANENT BONDING OF WAFERS

FIELD OF THE INVENTION

This invention relates to a method for bonding of a first contact surface of a first substrate to a second contact surface of a second substrate as claimed in claim 1.

BACKGROUND OF THE INVENTION

The objective in permanent or irreversible bonding of substrates is to produce an interconnection which is as strong and especially as irreversible as possible, therefore a high bond force, between the two contact surfaces of the substrates. There are various approaches and production methods for this in the prior art.

The known production methods and the approaches which have been followed to date often lead to results which cannot be reproduced or can be poorly reproduced and which can hardly be applied especially to altered conditions. In particular production methods which used at present often use high temperatures, especially >400° C. in order to ensure reproducible results.

Technical problems such as high energy consumption and possible destruction of structures which are present on the substrates result from the high temperatures of partially far above 300° C. which have been necessary to date for a high bond force.

Other demands consist in the following:
front-end-of-line compatibility.
This is defined as the compatibility of the process during the production of the electrically active components. The bonding process must therefore be designed such that active components such as transistors, which are already present on the structure wafers, are neither adversely affected nor damaged during the processing. Compatibility criteria include mainly the purity of the chemical elements (mainly in CMOS structures) and mechanical loadability, mainly by thermal stresses.
low contamination.
no application of force.
The reduction of the bond force leads to more careful treatment of the structure wafer and thus to a reduction of the failure probability by direct mechanical loading.

SUMMARY OF THE INVENTION

The object of this invention is therefore to devise a method for careful production of a permanent bond with a bond force which is as high as possible.

This object is achieved with the features of the independent claim(s). Advantageous developments of the invention are given in the dependent claims. All combinations of at least two of the features given in the specification, the claims and/or the figures also fall within the framework of the invention. At the given value ranges, values within the indicated limits will also be disclosed as boundary values and will be claimed in any combination.

The basic idea of this invention is to devise a reservoir for holding a first educt at least on one of the substrates, to react it after making contact or producing a temporary bond between the other substrate with a second educt which is present in the other substrate, and thus to form an irreversible or permanent bond between the substrates. Before or after forming the reservoir in one surface layer on the first contact surface, generally cleaning of the substrate or substrates, especially by a flushing step, occurs. This cleaning should generally ensure that there are no particles on the surfaces which would result in unbonded sites. The reservoir and the educt contained in the reservoir form a technical possibility for inducing a reaction which strengthens the permanent bond and which increases the bond speed in a controlled manner directly on the contact surfaces after producing the temporary or reversible bond, especially by deforming at least one of the contact surfaces by the reaction, preferably the contact surface which is opposite the reservoir.

For the prebonding step, for producing a temporary or reversible bond between the substrates there are various possibilities with the objective of producing a weak interaction between the contact surfaces of the substrates. The prebond strengths are below the permanent bond strengths, at least by a factor of 2 to 3, especially by a factor of 5, preferably by a factor of 15, still more preferably by a factor of 25. As guideline values the prebond strengths of pure, nonactivated, hydrophilized silicon with roughly 100 mJ/m$^2$ and of pure, plasma-activated hydrophilized silicon with roughly 200-300 mJ/m$^2$ are mentioned. The prebonds between the molecule-wetted substrates, mainly due to the van-der-Waals interactions between the molecules of the different permanent dipole moments, are suitable for enabling prebonds between wafers. The following chemical compounds are mentioned as interconnect agents by way of example, but not limited thereto water
thiols
AP3000
silanes and/or
silanols.

Suitable substrates as claimed in the invention are those whose material is able to react as an educt with another supplied educt to form a product with a higher molar volume, as a result of which the formation of a growth layer on the substrate is caused. The following combinations are especially advantageous, to the left of the arrow the educt being named and to the right of the arrow, the product/products, without the supplied educt or byproducts which react with the educt being named in particular:

$Si \rightarrow SiO_2$, $Si_3N_4$, $SiN_xO_y$
$Ge \rightarrow GeO_2$, $Ge_3N_4$
$\alpha\text{-}Sn \rightarrow SnO_2$
$B \rightarrow B_2O_3$, $BN$
$Se \rightarrow SeO_2$
$Te \rightarrow TeO_2$, $TeO_3$
$Mg \rightarrow MgO$, $Mg_3N_2$
$Al \rightarrow Al_2O_3$, $AlN$
$Ti \rightarrow TiO_2$, $TiN$
$V \rightarrow V_2O_5$
$Mn \rightarrow MnO$, $MnO_2$, $Mn_2O_3$, $Mn_2O_7$, $Mn_3O_4$
$Fe \rightarrow FeO$, $Fe_2O_3$, $Fe_3O_4$
$Co \rightarrow CoO$, $Co_3O_4$,
$Ni \rightarrow NiO$, $Ni_2O_3$
$Cu \rightarrow CuO$, $Cu_2O$, $Cu_3N$
$Zn \rightarrow ZnO$
$Cr \rightarrow CrN$, $Cr_{23}C_6$, $Cr_3C$, $Cr_7C_3$, $Cr_3C_2$
$Mo \rightarrow Mo_3C_2$
$Ti \rightarrow TiC$
$Nb \rightarrow Nb_4C_3$
$Ta \rightarrow Ta_4C_3$
$Zr \rightarrow ZrC$
$Hf \rightarrow HfC$
$V \rightarrow V_4C_3$, $VC$
$W \rightarrow W_2C$, $WC$
$Fe \rightarrow Fe_3C$, $Fe_7C_3$, $Fe_2C$ The following mixed forms of semiconductors as substrates are also conceivable:

GaP, GaAs, InP, InSb, InAs, GaSb, GaN, AlN, InN,
IV-IV: SiC, SiGe,
III-IV:InAlP,
nonlinear optics: $LiNbO_3$, $LiTaO_3$, KDP ($KH_2PO_4$)
solar cells: CdS, CdSe, CdTe, $CuInSe_2$, $CuInGaSe_2$, $CuInS_2$, $CuInGaS_2$
conductive oxides: $In_{2-x}Sn_xO_{3-y}$ As claimed in the invention, on at least one of the wafers and directly on the respective contact surface there is a reservoir in which a certain amount of at least one of the supplied educts for the volume expansion reaction can be stored. Educts can therefore be for example $O_2$, $O_3$, $H_2O$, N2, NH3, $H_2O_2$, etc. Due to the expansion, especially dictated by oxide growth, based on the tendency of the reaction partners to reduce system energy, possible gaps, pores, and cavities between the contact surfaces are minimized and the bond force is increased accordingly by narrowing the distances between the substrates in these regions. In the best possible case the existing gaps, pores and cavities are completely closed so that the entire bonding surface increases and thus the bond force as claimed in the invention rises accordingly.

The contact surfaces conventionally show a roughness with a quadratic roughness ($R_q$) of 0.2 nm. This corresponds to peak-to-peak values of the surfaces in the range of 1 nm. These empirical values were determined with atomic force microscopy (AFM).

The reaction as claimed in the invention is suitable for allowing the growth layer to grow by 0.1 to 0.3 nm for a conventional wafer surface of a circular wafer with a diameter of 200 to 300 mm with 1 monolayer (ML) of water.

As claimed in the invention it is therefore provided in particular that at least 2 ML, preferably at least 5 ML, even more preferably 10 ML fluid, especially water, is stored in the reservoir.

The formation of the reservoir by exposure to plasma is especially preferable, since plasma exposure moreover causes smoothing of the contact surface and hydrophilization as synergy effects. The surface is smoothed by plasma activation predominantly by a viscous flow of the material of the surface layer. The increase of the hydrophilicity takes place especially by the increase of the silicon hydroxyl compounds, preferably by cracking of Si—O compounds present on the surface, such as Si—O—Si, especially according to the following reaction:

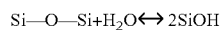

Si—O—Si+$H_2O$ ↔ 2SiOH

Another side effect, especially as a result of the aforementioned effects, consists in that the prebond strength is improved especially by a factor of 2 to 3.

The reservoir in the surface layer on the first contact surface of the first substrate is formed for example by plasma activation of the first substrate which has been coated with a thermal oxide. The plasma activation is carried out in a vacuum chamber in order to be able to adjust the conditions necessary for the plasma. As claimed in the invention, for the plasma discharge $N_2$ gas, $O_2$ gas or argon gas with ion energies in the range from 0 to 2000 eV is used, as a result of which a reservoir is produced with a depth of up to 20 nm, preferably up to 15 nm, more preferably up to 10 nm, most preferably up to 5 nm, of the treated surface, in this case the first contact surface. As claimed in the invention each particle type, atoms and/or molecules which are suitable for producing the reservoir can be used. Preferably those atoms and/or molecules are used which the reservoir produces with the required properties. The relevant properties are mainly the pore size, pore distribution and pore density. Alternatively, as claimed in the invention gas mixtures such as for example air or forming gas consisting of 95% Ar and 5% $H_2$ can be used. Depending on the gas used, in the reservoir during the plasma treatment among others the following ions are present: N+, $N_2$+, O+, $O_2$+, Ar+. The first educt can be accommodated in the unoccupied free space.

The reservoir is formed based on the following considerations: The pore size is smaller than 10 nm, preferably smaller than 5 nm, more preferably smaller than 1 nm, even more preferably smaller than 0.5 nm, most preferably smaller than 0.2 nm.

The pore density is preferably directly proportional to the density of the particles which produce the pores by striking action, most preferably can even be varied by partial pressure of the striking species, and depending on the treatment time and the parameter, especially of the plasma system used.

The pore distribution preferably has at least one region of greatest pore concentration under the surface, by variation of the parameters of several such regions which are superimposed into a preferably plateau-shaped region (see FIG. 7). The pore distribution decreases toward zero with increasing thickness. The region near the surface during bombardment has a pore density which is almost identical to the pore density near the surface. After the end of plasma treatment the pore density on the surface can be reduced as a result of stress relaxation mechanisms. The pore distribution in the thickness direction with respect to the surface has one steep flank and with respect to the bulk a rather flatter, but continuously decreasing flank (see FIG. 7).

For the pore size, the pore distribution and pore density, similar considerations apply to all methods not produced with plasma.

The reservoir can be designed by controlled use and combination of process parameters. FIG. 7 shows a representation of the concentration of injected nitrogen atoms by plasma as a function of the penetration depth into a silicon oxide layer. It was possible to produce two profiles by variation of the physical parameters. The first profile 11 was produced by more highly accelerated atoms more deeply in the silicon oxide, conversely the profile 12 was produced after altering the process parameters in a lower density. The superposition of the two profiles yields a sum curve 13 which is characteristic for the reservoir. The relationship between the concentration of the injected atoms and/or molecule species is evident. Higher concentrations designate regions with higher defect structure, therefore more space to accommodate the subsequent educt. A continuous change of the process parameters which is controlled in a dedicated manner during the plasma activation makes it possible to achieve a reservoir with a distribution of the added ions over the depth, which is as uniform as possible.

As a reservoir, alternatively to a reservoir produced by plasma, the use of a TEOS (tetraethyl orthosilicate)-oxide layer on at least one of the substrates, at least the first substrate, is conceivable. This oxide is generally less dense than thermal oxide, for which reason compaction is advantageous as claimed in the invention. The compaction takes place by heat treatment with the objective of setting a defined porosity of the reservoir.

According to one embodiment of the invention, the filling of the reservoir can take place especially advantageously at the same time with the formation of the reservoir by the reservoir being applied as a coating to the first substrate, the coating already encompassing the first educt.

The reservoir is conceivable as a porous layer with a porosity in the nanometer range or as a layer which has channels with a channel density smaller than 10 nm, more preferably smaller than 5 nm, even more preferably smaller than 2 nm, most preferably smaller than 1 nm, most preferably of all smaller than 0.5 nm.

For the step of filling of the reservoir with a first educt or a first group of educts, as claimed in the invention the following embodiments, also in combination, are conceivable:

exposing the reservoir to the ambient atmosphere, flushing with especially deionized water, flushing with a fluid which contains the educt or which consists of it, especially $H_2O$, $H_2O_2$, $NH_4OH$ exposing the reservoir to any gas atmosphere, especially atomic gas, molecular gas, gas mixtures, exposing the reservoir to a water vapor- or hydrogen peroxide vapor-containing atmosphere and depositing a reservoir already filled with the educt as a surface layer on the first substrate.

The following compounds are possible as educts: $O_2$, $O_3$, $N_2$, $NH_3$, $H_2O$, $H_2O_2$, and/or $NH_4OH$.

The use of the above cited hydrogen peroxide vapor is regarded as the preferred version in addition to using water. Hydrogen peroxide furthermore has the advantage of having a greater oxygen to hydrogen ratio. Furthermore, hydrogen peroxide dissociates above certain temperatures and/or via the use of high frequency fields in the MHz range into hydrogen and oxygen.

According to one advantageous embodiment of the invention, it is provided that the formation of the growth layer and strengthening of the irreversible bond take place by diffusion of the first educts into the reaction layer.

According to another advantageous embodiment of the invention it is provided that the formation of the irreversible bond takes place at a temperature of typically less than 300° C., advantageously less than 200° C., more preferably less than 150° C., even more preferably less than 100° C., most preferably at room temperature, especially during a maximum 12 days, more preferably a maximum 1 day, even more preferably a maximum 1 hour, most preferably a maximum 15 minutes.

Here it is especially advantageous if the irreversible bond has a bond strength of greater than 1.5 J/m², especially greater than 2 J/m², preferably greater than 2.5 J/m².

The bond strength can be increased especially advantageously in that during the reaction, as claimed in the invention a product with a greater molar volume than the molar volume of the second educt is formed in the reaction layer. In this way growth on the second substrate is effected, as a result of which gaps between the contact surfaces can be closed by the chemical reaction as claimed in the invention. As a result, the distance between the contact surfaces, therefore the average distance, is reduced, and dead spaces are minimized.

To the extent the formation of the reservoir takes place by plasma activation, especially with an activation frequency between 10 and 600 kHz and/or a power density between 0.075 and 0.2 watt/cm² and/or with pressurization with a pressure between 0.1 and 0.6 mbar, additional effects such as smoothing of the contact surface and also a clearly increased hydrophilicity of the contact surface are effected.

Alternatively thereto, the formation of the reservoir as claimed in the invention can take place by using a tetraethoxy silane-oxide layer as the surface layer, compacted especially in a controlled manner to a certain porosity.

According to another advantageous embodiment of the invention it is provided that the surface layer consists predominantly, especially essentially completely of an especially amorphous, especially silicon oxide produced by thermal oxidation, and the reaction layer consists of an oxidizable material, especially predominantly, preferably essentially completely, of Si, Ge, InP, GaP or GaN. An especially stable reaction which especially effectively closes the existing gaps is enabled by oxidation.

Here it is especially advantageous as claimed in the invention if between the second contact surface and the reaction layer there is a growth layer, especially predominantly of native silicon dioxide. The growth layer is subject to growth caused by the reaction as claimed in the invention. The growth takes place proceeding from the transition Si—SiO2 (7) by re-formation of amorphous SiO2 and the deformation caused thereby, especially bulging, of the growth layer, especially on the interface to the reaction layer, and especially in regions of gaps between the first and the second contact surface. This causes a reduction of the distance or a reduction of the dead space between the two contact surfaces, as a result of which the bond strength between the two substrates is increased. A temperature between 200 and 400° C., preferably roughly 200° C. and 150° C., more preferably a temperature between 150° C. and 100° C., most preferably a temperature between 100° C. and room temperature, is especially advantageous.

Here it is especially advantageous if the growth layer has an average thickness A between 0.1 nm and 5 nm prior to formation of the irreversible bond. The thinner the growth layer, the more quickly and easily the reaction takes place between the first and the second educt through the growth layer, especially by diffusion of the first educt thorough the growth layer to the reaction layer.

According to one embodiment of the invention it is advantageously provided that the formation of the reservoir is carried out in a vacuum. Thus contamination of the reservoir with unwanted materials or compounds can be avoided.

In another embodiment of the invention, it is advantageously provided that filling of the reservoir takes place by one or more of the steps cited below:

exposing the first contact surface to the atmosphere, for filling the reservoir with atmospheric humidity and/or oxygen contained in the air, exposing the first contact surface to a fluid consisting especially predominantly, preferably almost completely, of especially deionized $H_2O$ and/or $H_2O_2$, exposing the first contact surface to $N_2$ gas and/or $O_2$ gas and/or Ar gas and/or forming gas, especially consisting of 95% Ar and 5% $H_2$, especially with an ion energy in the range from 0 to 2000 eV, vapor deposition for filling the reservoir with any already named educt.

It is especially effective for the process sequence if the reservoir is formed preferably in a thickness R between 0.1 nm and 25 nm, more preferably between 0.1 nm and 15 nm, even more preferably between 0.1 nm and 10 nm, most preferably between 0.1 nm and 5 nm. Furthermore, according to one embodiment of the invention it is advantageous if the average distance B between the reservoir and the reaction layer immediately before formation of the irreversible bond is between 0.1 nm and 15 nm, especially between 0.5 nm and 5 nm, preferably between 0.5 nm and 3 nm.

A device for executing the method is as claimed in the invention formed with a chamber for forming the reservoir and a chamber provided especially separately for filling the reservoir and an especially separately provided chamber for forming the prebond, all of which chambers are connected directly to one another via a vacuum system.

In another embodiment the filling of the reservoir can also take place directly via the atmosphere, therefore either in a chamber which can be opened to the atmosphere or simply on a structure which does not have jacketing but can handle the wafer semiautomatically and/or completely automatically.

Other advantages, features and details of the invention will become apparent from the following description of preferred exemplary embodiments and using the drawings.

BRIEF DESCRIPTION OF THE DRAWINGS

FIG. 1 shows a first step of the method as claimed in the invention immediately after the first substrate makes contact with the second substrate, FIGS. 2a and 2b show other steps of the method as claimed in the invention for forming a higher bond strength, FIG. 3 shows another step of the method as claimed in the invention which follows the steps according to FIG. 1, FIG. 2a and FIG. 2b, with substrate contact surfaces which are in contact, FIG. 4 shows a step as claimed in the invention for formation of an irreversible/permanent bond between the substrates, FIG. 5 shows an enlargement of the chemical/physical processes which proceed on the two contact surfaces during the steps according to FIG. 3 and FIG. 4, FIG. 6 shows another enlargement of the chemical/physical processes which proceed on the interface between the two contact surfaces during the steps according to FIG. 3 and FIG. 4

The same components/features and components/features with the same action are identified with the same reference numbers in the figures.

DETAILED DESCRIPTION OF THE INVENTION

Figure 7:
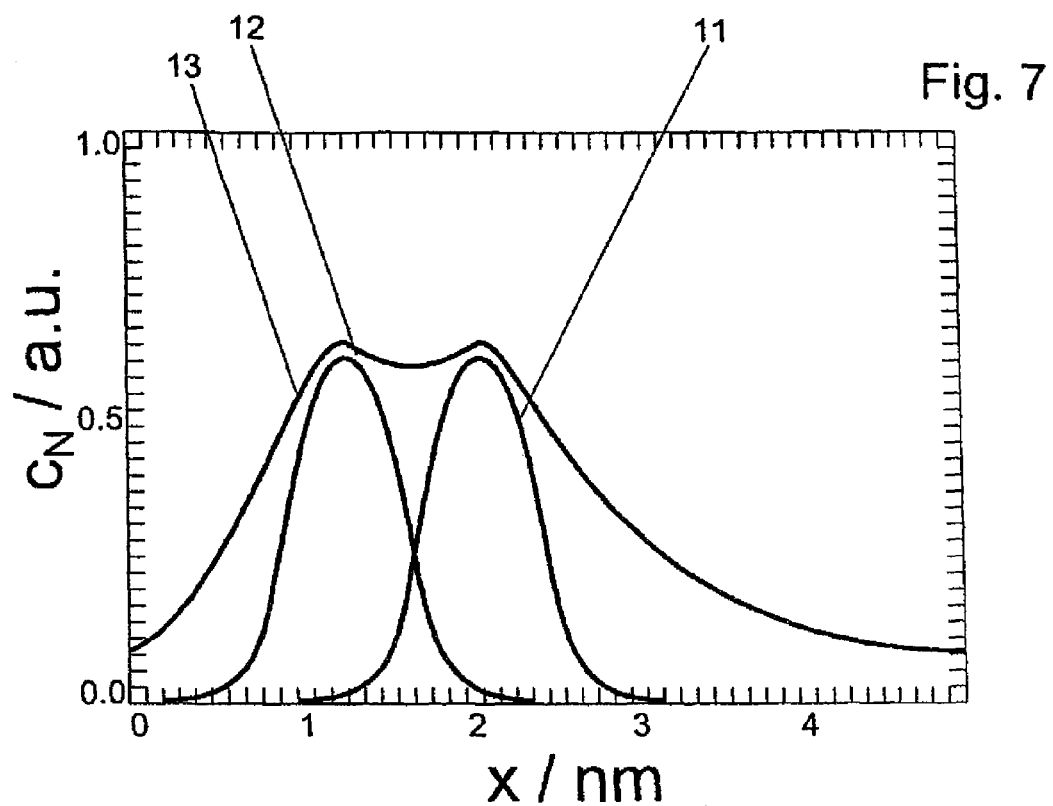
FIG. 7 shows a diagram of the production of the reservoir as claimed in the invention.

In the situation which is shown in FIG. 1 shows only a section of the chemical reactions which proceed during or immediately after the prebond step between a first contact surface 3 of a first substrate 1 and a second contact surface 4 of the second substrate 2. The surfaces are terminated with polar OH groups and are accordingly hydrophilic. The first substrate 1 and the second substrate 2 are held by the force of attraction of the water bridges between the OH groups present on the surface and the $H_2O$ molecules and between the $H_2O$ molecules alone. The hydrophilicity of at least the first contact surface 3 is increased by plasma treatment of the first contact surface 3 in a preceding step.

A reservoir 5 in a surface layer 6 consisting of thermal silicon dioxide has been formed as claimed in the invention by plasma treatment. Plasma treatment with $O_2$ ions with ion energies in the range between 0 and 2000 eV yields an average thickness R of the reservoir 5 of roughly 15 nm, the ions forming channels or pores in the surface layer 6.

Likewise the reservoir 5 is filled with $H_2O$ as the first educt prior to the step shown in FIG. 1 and after plasma treatment. Reduced species of the ions present in the plasma process can also be located in the reservoir, especially $O_2$, $N_2$, $H_2$, Ar.

The contact surfaces 3, 4 therefore still have a relatively wide gap, especially dictated by the water present between the contact surfaces 3, 4. Accordingly the existing bond strength is relatively small and is roughly between 100 $mJ/cm^2$ and 300 $mJ/cm^2$, especially more than 200 $mJ/cm^2$. In this connection the prior plasma activation plays a decisive part, especially due to the increased hydrophilicity of the plasma-activated first contact surface 3 and a smoothing effect which is caused by the plasma activation.

The process which is shown in FIG. 1 and which is called prebond can preferably proceed at ambient temperature or a maximum 50° Celsius. FIGS. 2a and 2b show a hydrophilic bond, the Si—O—Si bridge arising with splitting of water by —OH terminated surfaces. The processes in FIGS. 2a and 2b last roughly 300 h at room temperature. At 50° C. roughly 60 h. The state in FIG. 2b occurs at the indicated temperatures without producing the reservoir.

Between the contact surfaces 3, 4, $H_2O$ molecules are formed and provide at least partially for further filling in the reservoir 5 to the extent there is still free space. The other $H_2O$ molecules are removed. In the step according to FIG. 1 roughly 3 to 5 individual layers of OH groups or $H_2O$ are present and 1 to 3 monolayers of $H_2O$ are removed or accommodated in the reservoir 5 from the step according to FIG. 1 to the step according to FIG. 2a.

In the step shown in FIG. 2a the hydrogen bridge bonds are now formed directly between siloxane groups, as a result of which a greater bond force arises. This draws the contact surfaces 3, 4 more strongly to one another and reduces the distance between the contact surfaces 3, 4. Accordingly there are only 1 to 2 individual layers of OH groups between the contact surfaces 1, 2.

In the step shown in FIG. 2b, in turn with separation of $H_2O$ molecules according to the reaction which has been inserted below, covalent bonds in the form of silanol groups are formed between the contact surfaces 3, 4 which lead to a much stronger bond force and require less space so that the distance between the contact surfaces 3, 4 is further reduced until finally the minimum distance shown in FIG. 3 is reached based on the contact surfaces 3, 4 meeting one another:

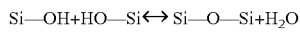

Up to stage 3, especially due to the formation of the reservoir 5, it is not necessary to unduly increase the temperature, rather even at room temperature to allow it to proceed. In this way an especially careful progression of the process steps according to FIG. 1 to FIG. 3 is possible.

In the method step shown in FIG. 4, the temperature is preferably increased to a maximum 500° Celsius, more preferably to a maximum 300° C., even more preferably to a maximum 200° C., most preferably to a maximum 100° C., most preferably of all not above room temperature in order to form an irreversible or permanent bond between the first and the second contact surface. These temperatures which are relatively low, in contrast to the prior art, are only possible because the reservoir 5 encompasses the first educt for the reaction shown in FIGS. 5 and 6:

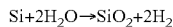

At the aforementioned slightly increased temperatures $H_2O$ molecules diffuse as the first educt from the reservoir 5 to the reaction layer 7. This diffusion can take place either via a direct contact of the surface layer 6 and growth layer 8 which are formed as oxide layers, or via a gap 9 or from a gap which is present between the oxide layers. There, silicon oxide, therefore a chemical compound with a greater molar volume than pure silicon is formed as a reaction product 10 of the aforementioned reaction from the reaction layer 7. The silicon dioxide grows on the interface of the reaction layer 7 with the growth layer 8 and thus deforms the layer of the growth layer 8 formed as native oxide in the direction of the gaps 9. Here $H_2O$ molecules from the reservoir are also required.

Due to the existence of the gaps which are in the nanometer range, there is the possibility of bulging of the native oxide layer 8, as a result of which stresses on the contact surfaces 3, 4 can be reduced. In this way the distance between the contact surfaces 3, 4 is reduced, as a result of which the active contact surface and thus the bond strength are further increased. The weld connection which arises in this way, which closes all pores, and which forms over the entire wafer, in contrast to the products in the prior art which are partially not welded, fundamentally contributes to increasing the bond force. The type of bond between the two amorphous silicon oxide surfaces which are welded to one another is a mixed form of covalent and ionic portion.

The aforementioned reaction of the first educt ($H_2O$) with the second educt (Si) takes place in the reaction layer especially quickly or at temperatures as low as possible to the extent an average distance B between the first contact surface 3 and the reaction layer 7 is as small as possible.

Therefore the pretreatment of the first substrate 1 and the selection of the second substrate 2 which consists of a reaction layer 7 of silicon and a native oxide layer as thin as possible as a growth layer 8 is decisive. A native oxide layer as thin as possible is provided as claimed in the invention for two reasons. The growth layer 8 is very thin so that it can bulge due to the newly formed reaction product 10 on the reaction layer 7 toward the surface layer 6 of the opposite substrate 1, which surface layer is made as an oxide layer, predominantly in regions of the nanogaps 9. Furthermore, diffusion paths as short as possible are desired in order to achieve the desired effect as quickly as possible and at a temperature as low as possible. The first substrate 1 likewise consists of a silicon layer and an oxide layer produced on it as a surface layer 6 in which a reservoir 5 is formed at least partially or completely.

The reservoir 5 as claimed in the invention is filled at least accordingly with the amount of the first educt which is necessary to close the nanogaps 9 so that an optimum growth of the growth layer 8 can take place to close the nanogaps 9 in a time as short as possible and/or at a temperature as low as possible.

REFERENCE NUMBER LIST 1 first substrate
2 second substrate
3 first contact surface
4 second contact surface
5 reservoir
6 surface layer
7 reaction layer
8 growth layer
9 nanogaps
10 reaction product
11 first profile
12 second profile
13 sum curve
A average thickness
B average distance
R average thickness Having described the invention, the following is claimed:

1. Method for bonding a first contact surface of a first substrate to a second contact surface of a second substrate, the second substrate having a reaction layer containing a second educt or a second group of educts, said method comprising:
   forming a reservoir in a surface layer on the first contact surface,
   at least partially filling the reservoir with a first educt or a first group of educts after the reservoir is formed,
   after the reservoir is filled with the first educt or the first group of educts, forming a prebond connection by bringing the first contact surface and the second contact surface into contact with each other, and
   forming a permanent bond between the first contact surface and the second contact surface, said permanent bond at least partially strengthened by a reaction of the first educt or the first group of educts with the second educt or the second group of educts contained in the reaction layer of the second substrate and by deforming at least one of the contact surfaces by the reaction of the first educt or the first group of educts with the second educt or the second group of educts.

2. Method as claimed in claim 1, wherein the surface layer is comprised of an amorphous material and the reaction layer is comprised of an oxidizable material.

3. Method as claimed in claim 2, wherein the surface layer is comprised of silicon oxide produced by thermal oxidation, and the reaction layer is comprised predominantly of Si, Ge, InP, GaP or GaN.

4. Method as claimed in claim 1, wherein a growth layer is formed between the second contact surface and the reaction layer, and wherein the growth layer is comprised predominantly of native silicon dioxide.

5. Method as claimed in claim 4, wherein before the forming of the permanent bond, the growth layer has an average thickness (A) between 1 angstrom and 10 nm.

6. Method as claimed in claim 1, wherein formation and/or strengthening of the permanent bond includes diffusion of the first educt or the first group of educts into the reaction layer.

7. Method as claimed in claim 1, wherein the forming of the permanent bond takes place at a temperature between room temperature and 200° Celsius during a maximum of 12 days.

8. Method as claimed in claim 1, wherein the permanent bond has a bond strength of greater than 1.5 $J/m^2$.

9. Method as claimed in claim 1, wherein the reservoir is formed by plasma activation.

10. Method as claimed in claim 1, wherein the forming of the reservoir includes using a compacted tetraethoxy silane-oxide layer as the surface layer.

11. Method as claimed in claim 1, wherein the reservoir is formed in a vacuum.

12. Method as claimed in claim 1, wherein the reservoir is filled by one or more of the following steps:
   exposing the first contact surface to an atmosphere with a high oxygen and/or water content,
   exposing the first contact surface to a fluid comprising deionized $H_2O$ and/or $H_2O_2$, and
   exposing the first contact surface to $N_2$ gas and/or $O_2$ gas and/or Ar gas and/or forming gas, comprising 95% Ar and 5% $H_2$, with an ion energy in the range from 0 to 200 eV.

13. Method as claimed in claim 1, wherein the reservoir has formed in an average thickness (R) between 0.1 nm and 25 nm.

14. Method as claimed in claim 1, wherein the average distance (B) between the reservoir and the reaction layer immediately before the forming of the permanent bond is between 0.1 nm and 15 nm.

15. Method as claimed in claim 1, wherein the permanent bond has a bond strength that is at least 2 times a bond strength of the prebond.

16. Method for bonding a first contact surface of a first substrate to a second contact surface of a second substrate, the second substrate having a reaction layer containing a second educt or a second group of educts, said method comprising:
   forming a reservoir in a surface layer on the first contact surface, at least partially filling the reservoir with a first educt or a first group of educts after the reservoir is formed, after the reservoir is filled with the first educt or the first group of educts, forming a prebond connection by bringing the first contact surface and the second contact surface into contact with each other, and forming a permanent bond between the first contact surface and the second contact surface, said permanent bond at least partially strengthened by a reaction of the first educt or the first group of educts with the second educt or the second group of educts contained in the reaction layer of the second substrate, wherein during the reaction of the first educt or the first group of educts with the second educt or the second group of educts a reaction product is formed in the reaction layer, said reaction product having a molar volume greater than a molar volume of the second educt or the second group of educts.

17. Method as claimed in claim 16, wherein the surface layer is comprised of an amorphous material and the reaction layer is comprised of an oxidizable material.

18. Method as claimed in claim 17, wherein the surface layer is comprised of silicon oxide produced by thermal oxidation, and the reaction layer is comprised predominantly of Si, Ge, InP, GaP or GaN.

19. Method as claimed in claim 16, wherein a growth layer is formed between the second contact surface and the reaction layer, and wherein the growth layer is comprised predominantly of native silicon dioxide.

20. Method as claimed in claim 19, wherein before the forming of the permanent bond, the growth layer has an average thickness (A) between 1 angstrom and 10 nm.

21. Method as claimed in claim 16, wherein formation and/or strengthening of the permanent bond includes diffusion of the first educt or the first group of educts into the reaction layer.

22. Method as claimed in claim 16, wherein the forming of the permanent bond takes place at a temperature between room temperature and 200° Celsius during a maximum of 12 days.

23. Method as claimed in claim 16, wherein the permanent bond has a bond strength of greater than 1.5 J/m$^2$.

24. Method as claimed in claim 16, wherein the reservoir is formed by plasma activation.

25. Method as claimed in claim 16, wherein the forming of the reservoir includes using a compacted tetraethoxy silane-oxide layer as the surface layer.

26. Method as claimed in claim 16, wherein the reservoir is formed in a vacuum.

27. Method as claimed in claim 16, wherein the reservoir is filled by one or more of the following steps:

exposing the first contact surface to an atmosphere with a high oxygen and/or water content, exposing the first contact surface to a fluid comprising deionized $H_2O$ and/or $H_2O_2$, and exposing the first contact surface to $N_2$ gas and/or $O_2$ gas and/or Ar gas and/or forming gas, comprising 95% Ar and 5% $H_2$, with an ion energy in the range from 0 to 200 eV.

28. Method as claimed in claim 16, wherein the reservoir has an average thickness (R) between 0.1 nm and 25 nm.

29. Method as claimed in claim 16, wherein the average distance (B) between the reservoir and the reaction layer immediately before the forming of the permanent bond is between 0.1 nm and 15 nm.

30. Method as claimed in claim 16, wherein the permanent bond has a bond strength that is at least 2 times a bond strength of the prebond.

* * * * *